(12) United States Patent
Shimazaki et al.

(10) Patent No.: US 7,601,011 B2
(45) Date of Patent: Oct. 13, 2009

(54) ELECTRICAL CONNECTING BOX AND METHOD FOR PROTECTING PRINTED CIRCUIT BOARD AND MOUNTED PARTS INSIDE THE ELECTRICAL CONNECTING BOX

(75) Inventors: Hirokazu Shimazaki, Chiyoda-ku (JP); Shin Hasegawa, Chiyoda-ku (JP); Akihiro Fuseya, Toyoake (JP); Manabu Matsumoto, Okazaki (JP); Koji Yonezu, Okazaki (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/834,357

(22) Filed: Aug. 6, 2007

(65) Prior Publication Data

US 2008/0030932 A1 Feb. 7, 2008

(30) Foreign Application Priority Data

Aug. 4, 2006 (JP) .............................. 2006-212859

(51) Int. Cl.
  *H01R 12/00* (2006.01)
(52) U.S. Cl. ...................................... 439/76.2; 361/736
(58) Field of Classification Search ................ 439/76.2, 439/949; 361/736, 752–759
See application file for complete search history.

(56) References Cited

U.S. PATENT DOCUMENTS 4,710,137 A * 12/1987 Perdue et al. ................ 439/457
6,226,188 B1 * 5/2001 Warren ........................ 361/802
6,920,050 B2 * 7/2005 Little et al. .................. 361/736
7,139,175 B2 * 11/2006 Hofmann ..................... 361/752
7,518,880 B1 * 4/2009 Ziberna ....................... 361/737

FOREIGN PATENT DOCUMENTS

| JP | 7-86769 | 3/1995 |
| JP | 8-148842 | 6/1996 |
| JP | 9-23536 | 1/1997 |
| JP | 9-238419 | 9/1997 |
| JP | 10-14058 | 1/1998 |
| JP | 10-126069 | 5/1998 |
| JP | 11-204958 | 7/1999 |
| JP | 2005-142215 | 6/2005 |

* cited by examiner

*Primary Examiner*—Thanh-Tam T Le
(74) *Attorney, Agent, or Firm*—Oblon, Spivak, McClelland, Maier & Neustadt, L.L.P.

(57) ABSTRACT

An electrical connecting box suitable to widely-ranging temperature conditions from high temperature to low temperature inside the engine room of a vehicle is described, having a printed circuit board 300 and a first protecting member 100 and a second protecting member 200 housing the printed circuit board in a sandwich state. In this electrical connecting box an extended portion 310 being a part of electrical parts is formed upon a board surface 301 on the side of the first protecting member of the printed circuit board. Additionally, first pillar portions 110 and a second pillar portion 120 are formed upon the inside surface of the first protecting member facing one side of the board surfaces, and a tip 111 and a tip 121 of these pillar portions, according to bending of the first protecting member, can be in either a contacted state or a spaced state with respect to the board surface 301 or, alternatively, a projecting body 321 fixed to the board surface. When the first pillar portions are contacting the one side of the board surfaces, there is a gap between the extended portion and the inside surface of the first protecting member such that they do not interfere with each other.

18 Claims, 3 Drawing Sheets

ELECTRICAL CONNECTING BOX AND METHOD FOR PROTECTING PRINTED CIRCUIT BOARD AND MOUNTED PARTS INSIDE THE ELECTRICAL CONNECTING BOX

BACKGROUND OF THE INVENTION

1. Field of the Invention

The present invention relates to electrical connecting boxes suitable for installation in locations such as engine rooms of vehicles, where temperature varies from high to low, and further relates to methods for protecting printed circuit boards and mounted parts thereon.

2. Description of the Related Art

In recent years, accompanying the rise in the need for vehicles to have various amenities, there has been a tendency for an increasing number of electrical components to be mounted in vehicles. Or more concretely, a variety of electrical components have become mountable onboard vehicles, including for example, audio systems, navigation systems, televisions, powered antennas, air conditioners, rear-window heaters, seat heaters, power seats, and suspension hardness control devices (as an example, refer to Japanese Patent Application Laid-Open Publication No. 2001-266997).

Power supply to these electrical vehicle components is conducted via an electrical connecting box installed in the vicinity of the battery inside the engine room. Furthermore, various electrical and electronic component parts such as fuses, relays are mounted in the electrical connecting box. The fuse prevents the outbreak of fire in the vehicle in the event of a short circuit between a wire harness and a body, as well as load failure of motor and the like. The relays control power supply to the vehicle's electrical components in conjunction with an operation of switch etc. in the vicinity of the driver's seat.

Generally, connections between the wire harness and the electrical connecting box are realized by means of connector connections.

FIG. 3 is an example of an electrical connecting box according to the related art of the present invention.

The electrical connecting box 5 has a configuration such that the printed circuit board is housed sandwiched in an enclosure comprised of an upper case 500 and a lower case 600. In the electrical connecting box 5, the above-described electrical and electronic parts are collectively mounted upon a printed circuit board. A mounted part 353 is mounted upon the surface of the printed circuit board 300 facing the upper case 500. A lead terminal 351 of an electronic part 350 extends via a through hole formed in the printed circuit board 300. Upon the lead terminal 351, for example, soldered portion 352 fixing the lead terminal 351 to the printed circuit board 300 are formed.

Since the upper case 500 and the lower case 600 are generally chosen to be composed of resin from an ease-of-molding and cost perspectives, it becomes easier situation for certain undesirable phenomena to occur after the cases 500 and 600 have been assembled as the electrical connecting box. The phenomena is physical interference between the upper case 500 or the lower case 600 and the lead terminal 351 or the soldered portion 352 upon the printed circuit board 300, or between the mounted part 353 like electrical or electronic parts and the upper case 500. Such interference derives from the introduction of unexpected variations in the dimensions of the cases 500 and 600 when they are shaped or are deformed afterwards by thermal effect of heat from the engine or external temperature.

For these reasons, in order to avoid impairing the functionality of the printed circuit board as a result of this kind of interference, generally, there is provided a considerably large clearance X between for example the upper case 500 and those parts upon the printed circuit board 300, as shown in FIG. 3. This clearance X is configured such that even if the upper case 500 undergoes bending, it will not adversely impact the functionality of the printed circuit board.

However, when this considerably large clearance is provided, the electrical connecting box itself becomes larger in dimension. And since the engine rooms of vehicles in recent years now house various other parts besides the engine, demand has risen for the size of the electrical connecting box itself to be made as small as possible.

SUMMARY OF THE INVENTION

A first aspect of the present invention, being an electrical connecting box housing a printed circuit board, has the following characteristics. The electrical connecting box has a printed circuit board, a first protecting member and a second protecting member housing the printed circuit board in a sandwich state, an extended portion extending from one side of the board surfaces of the printed circuit board, and facing to the first protecting member, and a first pillar portion formed upon an inside surface of the first protecting member facing the one side of the board surfaces.

The first pillar portion is configured such that their tips, according to bending of the first protecting member, can be contacted or spaced to the one side of the board surfaces or a contacting portion fixed upon the board surface. When the first pillar portion is contacted to the one side of the board surfaces or the contacting portion, a predetermined clearance is given between the extended portion and the inside surface of the first protecting member.

A second aspect of the present invention, being an electrical connecting box housing a printed circuit board, has the following characteristics. The electrical connecting box has a printed circuit board, a first protecting member and a second protecting member housing the printed circuit board in a sandwich state, an extended portion, being a part of electrical parts, formed extending from one side of the board surfaces of the printed circuit board that faces the first protecting member, and support means formed upon an inside surface of the first protecting member facing the one side of the board surfaces, means for forming a clearance in the state where the support means and the contacting portion are in a contacted state or the support means and the one side of the board surfaces are in a contacted state, the clearance being at least sufficient to prevent interference between the extended portion and the inside surface of the first protecting member.

A third aspect of the present invention, being a method for protecting a printed circuit board and a mounted part in an electrical connecting box, has the following characteristics. The method has the steps of preparing the printed circuit board, preparing a first protecting member and a second protecting member that house the printed circuit board in a sandwich state, preparing an extended portion, being a part of electrical parts and formed extending from one side of the board surfaces of the printed circuit board that faces the first protecting member, preparing a first pillar portion, formed upon the inside surface of the first protecting member, the inside surface facing the one side of the board surfaces, configuring the first pillar portion such that, their tips, according to bending of the first protecting member, can be in a contacted state or a spaced state with respect to the one side of the board surfaces or the contacting portion comprised of the projecting body fixed upon the one side of the board surfaces, forming a clearance such that, in the state where the first pillar portions and the contacting portion are in a contacted state, the clearance is at least sufficient to prevent interference between the extended portion and the inside surface of the first protecting member.

DETAILED DESCRIPTION OF THE INVENTION

Hereinafter, an electrical connecting box 1 according to one embodiment of the present invention, and a method for protecting the mounted components therein, will be described based on the accompanying drawings.

Figure 1:
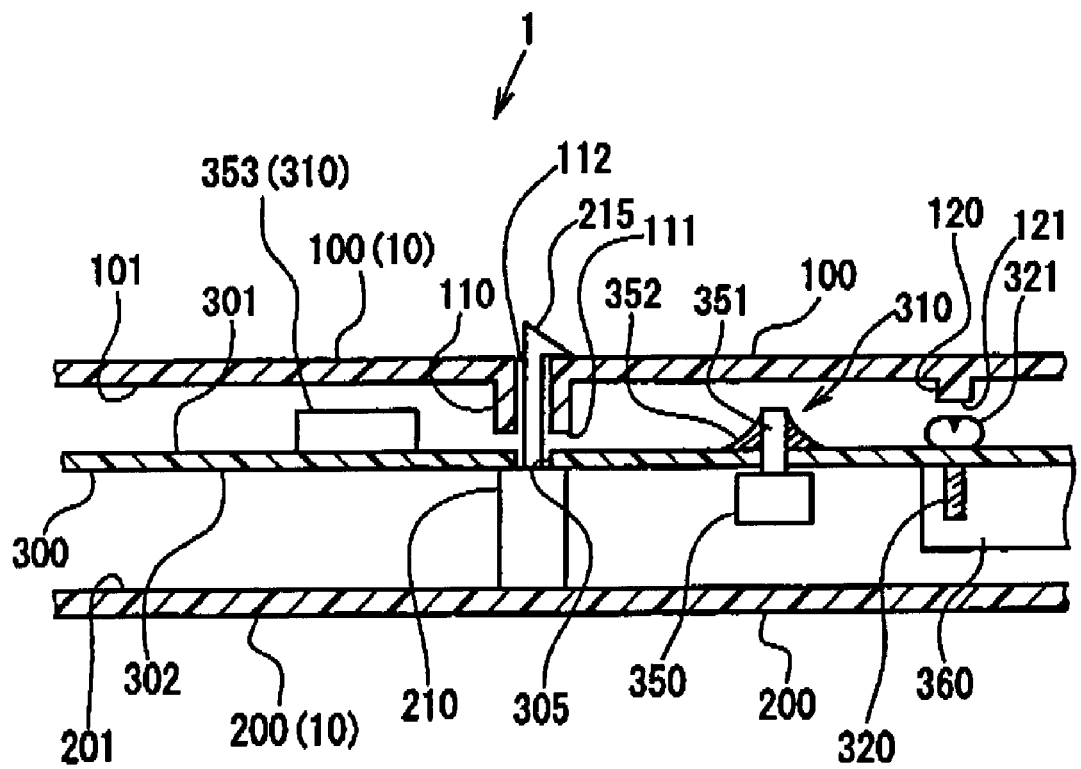
FIG. 1 is a cross-sectional view of one embodiment of an electrical connecting box according to the present invention, showing the state wherein the upper case is not deformed as a result of bending.

FIG. 1 shows a partial cross-section of an enclosure 10 having an upper case 100 and a lower case 200 of the electrical connecting box 1 and a printed circuit board 300.

The electrical connecting box 1, having an rectangular solid enclosure 10, houses in its interior the printed circuit board 300 mounting electrical and electronic parts. Additionally, although the details are not shown in the drawings, the electrical connecting box 1 is installed on the body frame in the engine room of a vehicle via bolts or other appropriate fasteners.

Figure 2:
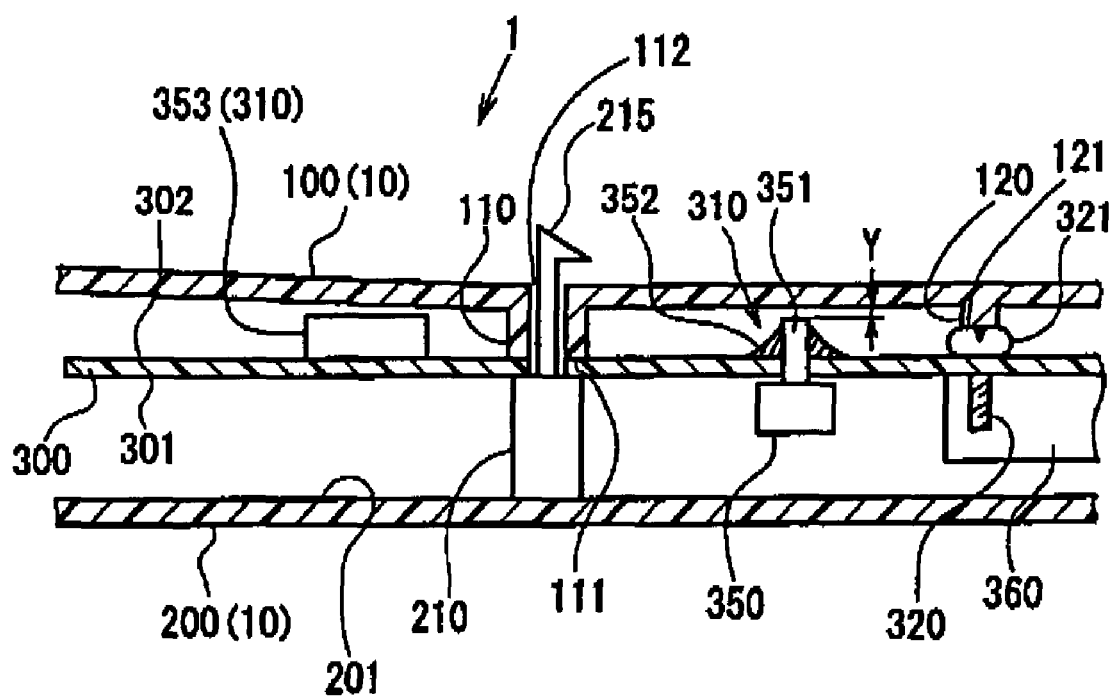
FIG. 2 is a view corresponding to FIG. 1, showing the state wherein the upper case 100 is deformed as a result of bending.
Figure 3:
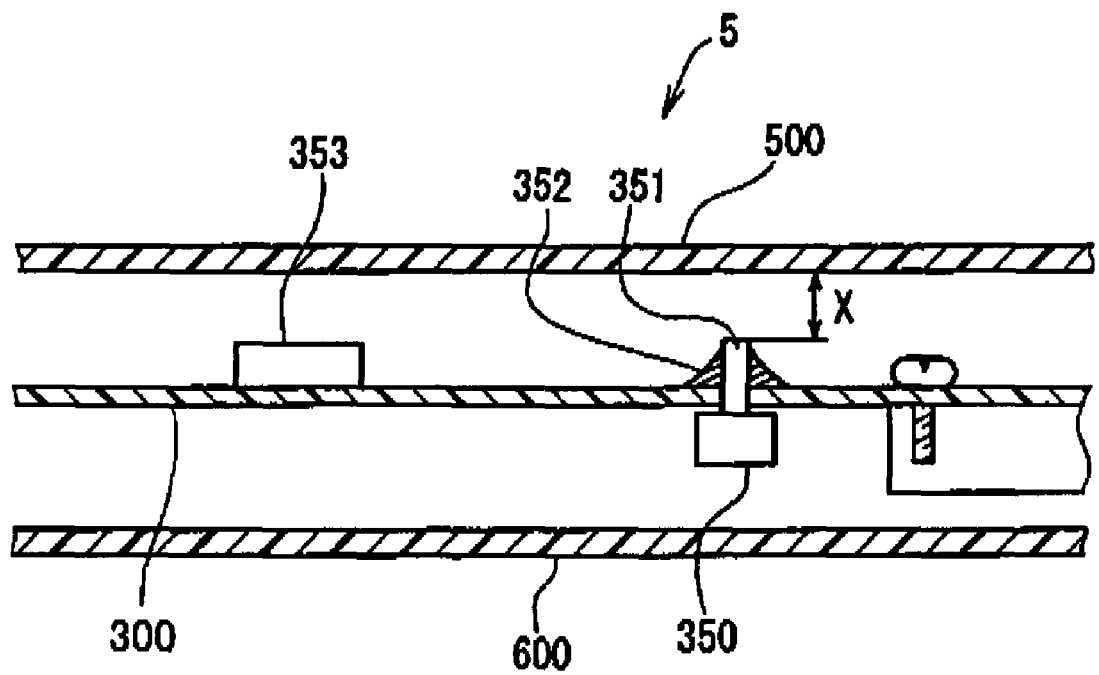
FIG. 3 is a cross-sectional view of an electrical connecting box according to the related art of the present invention, showing the state wherein the upper case is not deformed as a result of bending.

Printed circuit board 300 is made of, for example, glass epoxy resin, and mounted parts 353 are mounted on it. The mounted parts 353 are, for example, electrical or electronic devices such as power transistors, IC (integrated circuits), and relays that control a variety of electrical components, such as vehicle audio systems, navigation systems, televisions, power antennas, air conditioners, rear-window heaters, seat heaters, power seats, and suspension hardness control devices. Also, as shown in FIGS. 1 and 2, a connector 360 is fitted to the printed circuit board 300.

These mounted parts 353, extend from a board surface 301 (one example of the contacting portion according to the present invention) on an upper case side of the printed circuit board 300 to inside surface of the upper case 100. Such a portion of mounted part 353 is named an extended portion 310 here. In the case of the present embodiment, this extended portion 310 can be not only a body of such electrical or electronical devices but also a lead terminal 351 of an electronic part 350 extending to the one side of the board surfaces 301, or a soldered portion 352 surrounding the lead terminal 351. Additionally, a second hole portion 305 penetrated by an engaging portion 215 of a lower case 200 is formed in the printed circuit board 300, as described below.

The printed circuit board 300 is provided with a screw member 320 having a screw head 321 on the side of the board surface 301 that faces the upper case 100. This screw member 320 is a fastener to fix a connector 360 to the printed circuit board 300.

As described above, the enclosure 10 has the upper case 100 (one example of a first protecting member) and the lower case 200 (one example of a second protecting member), the cases 100 and 200 being made of a resin with superior strength, moldability, and heat-resistant properties, for example PP (polypropylene) or PBT (polybutylene terephthalate). The upper case 100 and the lower case 200 are fitted together via a fastening portion not shown in the drawings, and house and retain the printed circuit board 300 in a sandwich state.

A first rib 110 and a second rib 120, as embodiments of first pillar portions, are formed upon the inside surface of the upper case 100 that faces the one side of the board surfaces 301 of the printed circuit board 300. The tips 111 and 121 of these ribs 110 and 120 can be either contacted or spaced to the one side of the board surfaces 301 of the printed circuit board 300, where such "contacted" and "spaced" states can change from one to another according to bending state of the upper case 100. As FIG. 1 shows, when the upper case 100 in a regular state is not exhibiting mold variation or deformed by bending as a result of the influence of heat, the first rib 110 and the one side of the board surfaces 301, and the second rib 120 and the screw head 321 of the screw member 320, are respectively spaced at a predetermined distance.

On the contrary, when the tip 111 of the first rib 110 contacts the one side of the board surfaces 301 of the printed circuit board 300 as a result of mold variation of the upper case 100 or bending thereof caused by deformation due to heat, as shown in FIG. 2, a clearance (gap) Y is given between each of the extended portions 310 and the inside surface 101 of the upper case 100 in the present embodiment. The value of clearance Y is predetermined to be sufficiently larger than the minimum necessary width to keep the extended portion 310 and the interior surface 101 not to interfere with each other. In the case of the present embodiment, this clearance is not less than 0.5 mm and not more than 2.5 mm, for example 1.5 mm.

Similarly, the second rib 120 is configured such that its tip 121 can be contacted or spaced to the screw head 321 (the other example of the contacting portion according to the present invention) upon the one side of the board surfaces, the screw head 321 being a portion of the screw member 320 provided on the printed circuit board 300.

When the tip 121 of the second rib 120 contacts the screw head 321 of the screw member 320 upon the one side of the board surfaces as a result of mold variation of the upper case 100 or bending thereof caused by deformation due to heat, the same clearance Y is also given between the extended portion 310 of the one side of the board surfaces 301 and the inside surface 101 of the upper case 100 by same way of consideration as described above.

In addition, a first hole portion 112 that guides and fixes a engaging portion 215 of the lower case 200 is formed in the first rib 110 on the upper case 100. The engaging portion 215 penetrates through the first hole portion 112.

Meanwhile, a second pillar portion 210 projecting in the direction of and contacting a reverse-side board surface 302 on the lower case side of the printed circuit board 300, is formed upon an inside surface 201 of the lower case 200. This second pillar portion 210 is formed upon the inside surface 201 of the lower case 200 corresponding to the location where the first rib 110 provided on the upper case 100 contacts the printed circuit board 300. Additionally, the engaging portion 215 which engages the upper case 100 to the lower case 200, is formed extending out upon the tip of this second pillar portion 210. This engaging portion 215 penetrates both the second hole portion 305 formed in the printed circuit board 300 and the first hole portion 112 formed in the first rib 110, and the end of the engaging portion 215 is elastically hooked with the upper case 100.

The functions of the electrical connecting box having the above-described configuration will now be described. In the case where the upper case 100 is deformed to bend as a result of mold variation or deformation due to heat, the first pillar portions exemplified by the first rib 110 and the second rib 120, secure the clearance Y such that the inside surface of the upper case 100 does not interfere with the extended portion 310 of the mounted parts 353, lead terminal 351 or the soldered portion 352 formed upon the printed circuit board. This clearance Y is realized as a result of at least one of either the first rib 110 contacting the one side of the board surfaces 301 or the second rib 120 contacting the screw head 321 of the screw member 320 provided upon the one side of the board surfaces 301. As a result, the spacing between the upper case 100 and the printed circuit board 300 can be minimized as far as the clearance Y is secured. Therefore, the electrical connecting box can be made more compact than previous type of electrical connecting box.

It should be noted that, since the first rib 110 and the second rib 120 formed as parts of the upper case 100 also act the first pillar portions, the above-described advantages can be achieved using a highly simple configuration without increase of component parts in number.

In addition, as shown in FIG. 1, the first rib 110 of the upper case 100 serves not only as the first pillar portion but also as a guide for the engaging portion 215 of the lower case 200. Thus, structural simplification and miniaturization of the electrical connecting box is achieved.

In addition, when the upper case 100 is bent, the stress applied to the printed circuit board 300 by the second rib 120 is instead received by the screw head 321 provided upon the printed circuit board 300. Hence, this stress is transmitted to the screw member 320 via the screw head 321 and subsequently dispersed at the connector 360 installed by the screw member 320. As a result, the direct application of all the stress upon the printed circuit board 300 is lowered.

It should also be noted that, although in the case of the present embodiment the first pillar portions is the first rib 110 and the second rib 120 extending from the inside surface of the upper case 100 and facing the one side of the board surfaces 301 of the printed circuit board 300, the first pillar portions are not limited in configuration to these two ribs. For example, the first pillar portions can be a singular rib, or three or more ribs. Additionally, the forms of the first pillar portions are not limited to such rib shapes.

The temperature of the inside of the engine rooms of vehicles widely changes from high to low, for example from −40° to 120° C., when the vehicle is in operation. In the case where the electrical connecting box 1 according to the present embodiment is mounted in the engine room of a vehicle, the bad effects caused by such severe temperature changes to the printed circuit board 300 are prevented as described above and stable operation of the electrical connecting box 1 can be achieved.

It should be noted that mounting location of the electrical connecting box 1 according to the present embodiment can be applied to not only inside of the vehicle's engine room but also an inside of the vehicle's personal space etc.

In addition, although the present embodiment has been described such that the ribs comprising the first pillar portions are spaced to the printed circuit board in regular state (for example in a room-temperature 25° C. state), it is to be understood that other configurations can be included within the scope of the present invention. For example, the first pillar portions can be separably contacted with the printed circuit board in such regular state.

In addition, such first pillar portions may be disposed distributedly over the inside surface of the upper case. As a result of this configuration, when the upper case (i.e., the first protecting member) is deformed, the first pillar portions of the upper case distribute the stress imparted to the printed circuit board over a plurality of locations upon the printed circuit board. As a result, the clearance Y between the extended portion and the upper case can be secured at the whole part of the printed circuit board, thereby keeping the thickness of the electrical connecting box to the minimum, and making the further miniaturization of the electrical connecting box realizable.

What is claimed is:

1. An electrical connecting box, comprising:
   a printed circuit board;
   a first protecting member and a second protecting member housing the printed circuit board in a sandwich state;
   an extended portion extending from one side of a board surface of the printed circuit board, and facing the first protecting member;
   a first pillar portion formed upon an inside surface of the first protecting member and facing the one side of the board surface, a tip of the first pillar portion having a clearance with the one side of the board surface when the first protecting member undergoes no bending;
   a second pillar portion that faces the printed circuit board, extends to the printed circuit board and is placed on an inside surface of the second protecting member;
   an engaging portion extending from the second protecting member and engaging the first protecting member;
   a first hole portion, formed in the first protecting member, that guides and fixes the engaging portion through the first pillar portion; and
   a second hole portion, formed in the printed circuit board, that is configured to be penetrated by the engaging portion, wherein
   the first pillar portion is configured such that the tip of the first pillar portion, upon the bending of the first protecting member, contacts the board at the one side of the board surface or at a contacting portion fixed on the board surface;
   the engaging portion penetrates the second hole portion in the printed circuit board and the first hole portion in the first pillar portion and engages the first protecting member,
   the second pillar portion, in a location corresponding to where the first pillar portions contact the printed circuit board, contacts a reverse-side board surface of the printed circuit board which faces the second protecting member, and
   when the first protecting member is bent towards the printed circuit board, the tip of the first pillar portion contacts the board at the one side of the board surface or at the contacting portion, such that a gap exists between the extended portion and the inside surface of the first protecting member.

2. The electrical connecting box according to claim 1, wherein the first pillar portion is a rib formed by extending an inside surface of the first protecting member to the one side of the board surface.

3. The electrical connecting box according to claim 1, further comprising:
   a screw member formed upon the printed circuit board for fixing a connector to the printed circuit board and having a screw head upon the one side of the board surface, wherein the screw head acts as the contacting member.

4. The electrical connecting box according to claim 1, wherein the first pillar portion is disposed distributedly over the inside surface of the first protecting member so as to contact or be spaced from a plurality of locations on the one side of the board surface.

5. The electrical connecting box according to claim 1, wherein the first and the second protecting members are made of resin.

6. The electrical connecting box according to claim 1, wherein the printed circuit board is made of glass epoxy resin.

7. The electrical connecting box according to claim 1, further comprising:
electrical and/or electronic mounted parts upon the printed circuit board.

8. The electrical connecting box according to claim 1, wherein the gap between the inside surface of the first protecting member and the extended portion is not less than 0.5 mm.

9. The electrical connecting box according to claim 1, wherein the gap between the inside surface of the first protecting member and the extended portion is not more than 2.5 mm.

10. The electrical connecting box according to claim 1, wherein the gap between the inside surface of the first protecting member and the extended portion is approximately 1.5 mm.

11. The electrical connecting box according to claim 1, wherein the gap between the inside surface of the first protecting member and the extended portion is secured at least within a temperature range from −40° to 120° C.

12. The electrical connecting box according to claim 1, wherein the first pillar portion is spaced to the first side of the board surface at 25° C.

13. The electrical connecting box according to claim 1, wherein the first pillar portion is separably contacted to the one side of the board surface at 25° C.

14. The electrical connecting box according to claim 2, wherein the first pillar portion is spaced apart over the inside surface of the first protecting member so as to contact or be spaced from a plurality of locations on the one side of the board surface.

15. The electrical connecting box according to claim 1, wherein the engaging portion penetrates and is fixed by the first hole portion in an interlocking manner, such that the engaging portion and the first hole portion allow bending of the first protecting member away from an axial direction of the box.

16. The electrical connecting box according to claim 2, wherein the engaging portion penetrates and is fixed by the first hole portion in an interlocking manner, such that the engaging portion and the first hole portion allow bending of the first protecting member away from an axial direction of the box.

17. The electrical connecting box according to claim 4, wherein the engaging portion penetrates and is fixed by the first hole portion in an interlocking manner, such that the engaging portion and the first hole portion allow bending of the first protecting member away from an axial direction of the box.

18. The electrical connecting box according to claim 14, wherein the engaging portion penetrates and is fixed by the first hole portion in an interlocking manner, such that the engaging portion and the first hole portion allow bending of the first protecting member away from an axial direction of the box.

* * * * *